United States Patent
Zhang et al.

(10) Patent No.: US 12,237,213 B2
(45) Date of Patent: *Feb. 25, 2025

(54) METHOD FOR MANUFACTURING SEMICONDUCTOR DEVICE

(71) Applicant: INSTITUTE OF MICROELECTRONICS, CHINESE ACADEMY OF SCIENCES, Beijing (CN)

(72) Inventors: Libin Zhang, Beijing (CN); Yayi Wei, Beijing (CN); Zhen Song, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/631,932

(22) PCT Filed: Nov. 12, 2021

(86) PCT No.: PCT/CN2021/130254
§ 371 (c)(1),
(2) Date: Feb. 1, 2022

(87) PCT Pub. No.: WO2023/065432
PCT Pub. Date: Apr. 27, 2023

(65) Prior Publication Data
US 2024/0038584 A1    Feb. 1, 2024

(30) Foreign Application Priority Data

Oct. 21, 2021    (CN) .......................... 202111228704.0

(51) Int. Cl.
*H01L 21/768*    (2006.01)
*H01L 29/40*    (2006.01)
*G03F 7/09*    (2006.01)

(52) U.S. Cl.
CPC .. *H01L 21/76802* (2013.01); *H01L 21/76877* (2013.01); *H01L 29/401* (2013.01); *G03F 7/094* (2013.01)

(58) Field of Classification Search
CPC ............... H01L 21/027; H01L 21/0274; H01L 21/31144; H01L 21/76897; H01L 21/76802; H01L 21/76877
See application file for complete search history.

(56) References Cited

U.S. PATENT DOCUMENTS 5,277,749 A * 1/1994 Griffith ............. H01L 21/76885
257/E21.589
5,935,763 A * 8/1999 Caterer ................. G03F 7/0035
257/E21.507

(Continued)

FOREIGN PATENT DOCUMENTS

CN    102636967 A    8/2012

OTHER PUBLICATIONS

International Search Report and Written Opinion of the International Searching Authority issued on Jul. 6, 2022 for PCT/CN2021/130254.

*Primary Examiner* — Bac H Au
(74) *Attorney, Agent, or Firm* — Goodwin Procter LLP

(57) ABSTRACT

A method for manufacturing a semiconductor device. A photolithographic coating, including a first film, a photolithographic film, and a second film, is formed on the to-be-connected structure. Refractive indexes of the first film and the second film are smaller than 1. The photolithographic coating is exposed to a light having a first wavelength, to image the to-be-connected structure to a first region of the photolithographic film. The photolithographic coating is exposed to a light having a second wavelength through a mask, to image the mask to a second region of the photolithographic film. A region in which the first region and (Continued)

the second region overlap serves as a connection region corresponding to the to-be-connected structure, and thereby self-alignment between a layer of the to-be-connected structure and a layer where a contact hole is arranged is implemented.

13 Claims, 4 Drawing Sheets

(56) References Cited

U.S. PATENT DOCUMENTS

| | | | | |
|---|---|---|---|---|
| 6,080,654 | A * | 6/2000 | Manchester | H01L 21/76802 257/374 |
| 6,376,292 | B1 * | 4/2002 | Youn | H01L 21/823456 257/E21.624 |
| 6,485,894 | B1 * | 11/2002 | Akatsu | G03F 7/2002 430/311 |
| 2007/0154850 | A1 * | 7/2007 | Menon | G03F 7/70466 430/394 |
| 2015/0303308 | A1 | 10/2015 | Wei et al. | |
| 2016/0225801 | A1 | 8/2016 | Yun et al. | |
| 2016/0363865 | A1 | 12/2016 | Zhang et al. | |
| 2019/0334028 | A1 * | 10/2019 | Zi | H01L 21/823431 |
| 2024/0055254 | A1 * | 2/2024 | Zhang | H01L 21/76897 |

\* cited by examiner

METHOD FOR MANUFACTURING SEMICONDUCTOR DEVICE

The present application is the national phase of International Application No. PCT/CN2021/130254, titled "Method For Manufacturing Semiconductor Device," filed on Nov. 12, 2021, which claims priority to Chinese Patent Application No. CN202111228704.0, titled "Method For Manufacturing Semiconductor Device," filed on Oct. 21, 2021 with the China National Intellectual Property Administration, which is incorporated herein by reference in its entirety.

FIELD

The present disclosure relates to the field of semiconductor devices, and in particular to a method for manufacturing a semiconductor device.

BACKGROUND

It is particularly important to ensure alignment between different layers when manufacturing a semiconductor device. A large error in the alignment may result in a failure in electrical connection between different layers, thereby deteriorating performances of the manufactured semiconductor device. Self-alignment techniques are important means to implement the alignment between different layers. At present, such techniques are commonly applied to alignment between a metal layer and an interconnection layer.

A limitation of the self-alignment techniques results in a large error when manufacturing semiconductor devices, for example, when forming a contact hole, which reduces a yield of a manufactured semiconductor.

Therefore, it is urgent to provide a method for manufacturing a semiconductor, which can improve accuracy of the alignment between different layers and reduce an error in the alignment.

SUMMARY

In view of the above, a method for manufacturing a semiconductor device is provided according to embodiments of the present disclosure, in order to improve accuracy of alignment between different layers and reduce an error in the alignment.

Following technical solutions are provided according to embodiments of the present disclosure to achieve the above objective.

A method for manufacturing a semiconductor device is provided according to an embodiment of the present disclosure. The semiconductor device includes a substrate and a to-be-connected structure disposed on a side of the substrate. The method includes:

forming a photolithographic coating on the to-be-connected structure, where the photolithographic coating includes a first film, a photolithographic film, and a second film which are stacked in the above-listed sequence, and refractive indexes of the first film and the second film are smaller than 1;

exposing the photolithographic coating to a light having a first wavelength, to image the to-be-connected structure to a first region of the photolithographic film; and exposing the photolithographic coating to a light having a second wavelength through a mask, to image a pattern of the mask to a second region of the photolithographic film, where a region in which the first region and the second region overlap serves as a connection region corresponding to the to-be-connected structure.

In an embodiment, a thickness of the photolithographic coating is predetermined based on light intensity, which in the photolithographic film when the photolithographic coating is exposed to the light having the first wavelength.

In an embodiment, before forming the photolithographic coating on the to-be-connected structure, the method further includes: forming a dielectric layer on the to-be-connected structure, where the dielectric layer is disposed between the to-be-connected structure and the photolithographic coating.

After exposing the photolithographic coating to the light having the second wavelength through the mask, the method further includes: etching the dielectric layer corresponding to the connection region through the photolithographic film, to obtain a contact hole running through the dielectric layer, where the to-be-connected structure is exposed by the contact hole.

In an embodiment, before etching the dielectric layer corresponding to the connection region through the photolithographic film, the method further includes: removing the second film.

In an embodiment, after etching the dielectric layer corresponding to the connection region through the photolithographic film to obtain the contact hole running through the dielectric layer, the method further includes: filling the contact hole with metal, to form a metal contact. The metal contact is connected with the to-be-connected structure.

In an embodiment, the photolithographic film is made of a photoresist, and the first film and the second film are made of metal materials.

In an embodiment, the light having the first wavelength is a visible light or an ultraviolet light, and the light having the second wavelength is another ultraviolet light.

In an embodiment, the first wavelength is 633 nm, 532 nm, or 365 nm, and the second wavelength is 365 nm, 248 nm, or 193 nm.

In an embodiment, the to-be-connected structure is at least one of: a gate structure, a source structure, or a drain structure.

In an embodiment, a feature size of the pattern of the mask is larger than a feature size of the to-be-connected structure.

The method for manufacturing the semiconductor device is provided according to embodiments of the present disclosure. The semiconductor device includes the substrate and the to-be-connected structure disposed on the side of the substrate. The photolithographic coating is formed on the to-be-connected structure. The photolithographic coating includes the first film, the photolithographic film, and the second film, which are stacked in the above-listed sequence. The refractive indexes of the first film and the second film are smaller than 1, so that the photolithographic coating forms an optical structure with a high reflection coefficient. Then, the photolithographic coating is exposed to the light having the first wavelength. The to-be-connected structure is reflected in the photolithographic coating, and hence serves as a mask and is imaged to the first region of the photolithographic film. Afterwards, the photolithographic coating is exposed to the light having the second wavelength through the mask. The mask is imaged to the second region of the photolithographic film. The region in which the first region and the second region overlap serves as the connection region corresponding to the to-be-connected structure. That is, positions at the to-be-connected structure are imaged into the first region of the photolithographic film after the exposure with the light having the first wavelength, and the pattern of the mask is imaged to the second region of the photolithographic film after the exposure with the light having the second wavelength. The region in which the first region overlaps the second region corresponds to the to-be-connected structure, and thereby self-alignment between a layer of the to-be-connected structure and a layer where the contact hole is arranged is implemented. Only the region in which the imaging regions of the two exposures overlap corresponds to the to-be-connected structure, which improves accuracy of the alignment between different layers and reduces the error of the alignment.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION OF EMBODIMENTS

Figure 1:
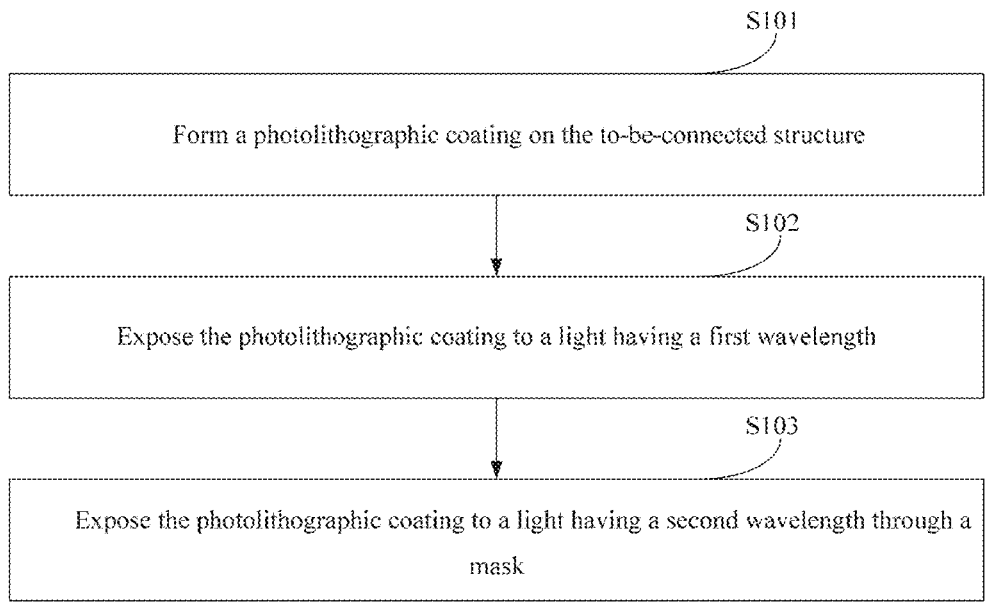
FIG. 1 is a flowchart of a method for manufacturing a semiconductor device according to an embodiment of the present disclosure.

In order to make the above objectives, features and advantages of the present disclosure obvious and understandable, hereinafter embodiments of the present disclosure are described in detail in combination with the drawings.

Many details are set forth in following description to facilitate a full understanding of the present disclosure. The present disclosure may further be implemented in other ways different from those described herein. Those skilled in the art may deduct by analogy without violating a core concept of the present disclosure. Therefore, the present disclosure is not limited to embodiments disclosed below.

The present disclosure is described in detail in conjunction with the schematic diagrams. When embodiments of the present disclosure are described in detail, a part of a device may not be enlarged according to a general scale in a sectional view showing a structure of the device, in order to facilitate illustration. The schematic diagrams are only exemplary, which should not be construed as limitation on the protection scope of the present disclosure. In addition, dimensions in a three-dimensional space, for example, including a length, a width, and a depth should be set in actual manufacture.

At present, self-alignment techniques are important means to implement alignment between different layers. The self-alignment is commonly utilized to implement alignment between a metal layer and an interconnection layer.

After a source, a drain, or a gate of a semiconductor device is formed, there is no effective self-alignment technique capable to align a contact hole, which is configured to connect the source, the drain, or the gate with outside (lead the source, the drain, or the gate out), accurately with the source, the drain, or the gate when forming the contact hole.

In order to address the above issue, a method for manufacturing a semiconductor device is provided according to an embodiment of the present disclosure. The semiconductor device includes a substrate and a to-be-connected structure disposed on a side of the substrate. A photolithographic coating is formed on the to-be-connected structure. The photolithographic coating includes a first film, a photolithographic film, and a second film, which are stacked in the above-listed sequence. Refractive indexes of the first film and the second film are smaller than 1, so that the photolithographic coating forms an optical structure with a high reflection coefficient. Then, the photolithographic coating is exposed to a light having a first wavelength. The to-be-connected structure is reflected in the photolithographic coating, and hence serves as a mask and is imaged to a first region of the photolithographic film. Afterwards, the photolithographic coating is exposed to a light having a second wavelength through a mask. The mask is imaged to a second region of the photolithographic film. A region in which the first region and the second region overlap serves as a connection region corresponding to the to-be-connected structure. That is, positions at the to-be-connected structure are imaged into the first region of the photolithographic film after the exposure with the light having the first wavelength, and the pattern of the mask is imaged to the second region of the photolithographic film after the exposure with the light having the second wavelength. The region in which the first region overlaps the second region corresponds to the to-be-connected structure, and thereby self-alignment between a layer of the to-be-connected structure and a layer where the contact hole is arranged is implemented. Only the region in which the imaging regions of the two exposures overlap corresponds to the to-be-connected structure, which improves accuracy of the alignment between different layers and reduces the error of the alignment.

In order to facilitate understanding technical solutions and technical effects of the present disclosure, hereinafter embodiments are described in detail in conjunction with the drawings.

Figure 2:
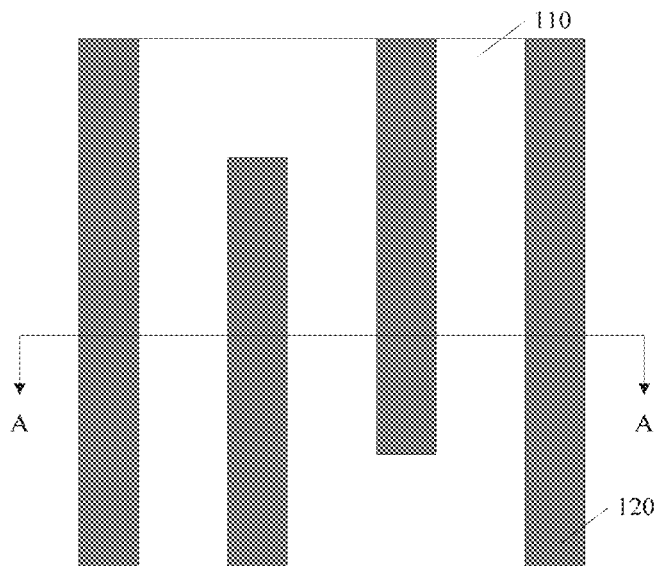
FIG. 2 is a top view of a structure of a semiconductor device according to an embodiment of the present disclosure.
Figure 3:
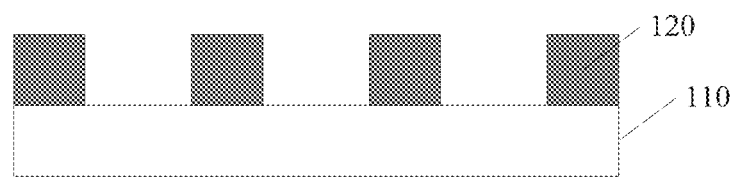
FIG. 3 is a cross-sectional view of a semiconductor device as shown in FIG. 2 along a direction indicated by AA.

Reference is made to FIG. 1, which is a flowchart of a method for manufacturing a semiconductor device according to an embodiment of the present disclosure. In this embodiment, a semiconductor device 100 includes a substrate 110 and a to-be-connected structure 120 disposed on a side of the substrate 110. Reference is made to FIG. 2 and FIG. 3. FIG. 2 is a top view of a structure of a semiconductor device 100 according to an embodiment of the present disclosure, and FIG. 3 is a cross-sectional view along a direction indicated by AA, of the semiconductor device as shown in FIG. 2. In this embodiment, the to-be-connected structure 120 may be at least one of a gate structure, a source structure, or a drain structure. The to-be-connected structure 120 may be made of a metal material having good conductivity. In another embodiment, the to-be-connected structure may be a structure in a layer serving as a target of alignment.

In one embodiment, the substrate 110 is a semiconductor substrate, such as a Si substrate, a Ge substrate, a SiGe substrate, an SOI (silicon on insulator) substrate, or a GOI (germanium on insulator) substrate. In another embodiment, the semiconductor substrate may be a substrate including another elementary semiconductor or another compound semiconductor, such as quartz, GaAs, InP, or SiC. The semiconductor substrate may alternatively be a stacked structure such as Si/SiGe, or another epitaxial structure such as SGOI (silicon-germanium on insulator). In this embodiment, the substrate 110 is a silicon substrate.

In practical applications, another film may be formed between the substrate 110 and the to-be-connected structure 120, so as to form various semiconductor devices.

As an example, stacked layers and a channel structure running through the stacked layers are formed between the substrate 110 and the to-be-connected structure 120. In such case, the semiconductor device may be a three-dimensional memory device.

As another example, a doped layer or another dielectric film is formed between the substrate 110 and the to-be-connected structure 120. In such case, the semiconductor device may be a logic device, such as a transistor.

The method includes the following steps S101 to S103.

Figure 4:
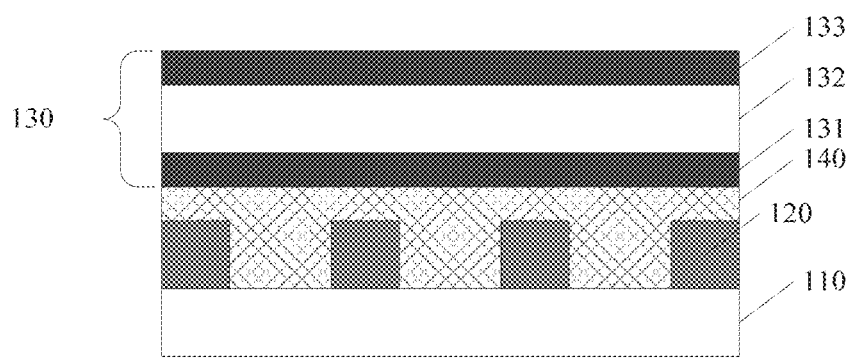
FIG. 4 and FIG. 5 are schematic structural diagrams of a semiconductor device manufactured through a method according to an embodiment of the present disclosure.

In step S101, a photolithographic coating 130 is formed on the to-be-connected structure 120. Reference is made to FIG. 4.

In embodiments of the present disclosure, the photolithographic coating 130 is formed on the to-be-connected structure 120. The photolithographic coating 130 is patterned, such that a metal contact is formed through the patterned photolithographic coating 130, and the to-be-connected structure 130 is electrically connected to outside (led out) via the metal contact.

In practical applications, before the photolithographic coating 130 is formed on the to-be-connected structure 120, a dielectric layer 140 is first formed on the to-be-connected structure 120. That is, the dielectric layer 140 is disposed between the to-be-connected structure 120 and the photolithographic coating 130, as shown in FIG. 4. The dielectric layer 140 may be made of a material with good insulation, such as silicon oxide. The dielectric layer 140 may be formed by depositing a dielectric material through deposition techniques. When the dielectric material is deposited on the to-be-connected structure 120, the formed dielectric layer 140 is conformal with the to-be-connected structure 120, so that morphology of the dielectric layer 140 is similar to that of the to-be-connected structure 120. In such case, the dielectric layer 140 may be ground by a device for chemical mechanical grinding. Hence, the obtained dielectric layer 140 has high flatness, and the photolithographic coating 130 can be formed on the flat dielectric layer 140 in a subsequent step.

In embodiments of the present disclosure, the photolithographic coating 130 includes a first film 131, a photolithographic film 132, and a second film 133 that are stacked in the above-listed sequence. Refractive indexes of the first film 131 and the second film 132 are smaller than 1. An optical structure of the photolithographic coating 130 including the first film 131, the photolithographic film 132, and the second film 133 is similar to a sandwich. Two outer layers of the photolithographic coating are films each having a refractive index smaller than 1. An incident light is reflected and oscillates in the photolithographic coating 130, and hence intensity of the incident light is enhanced by the reflection and the oscillation.

The photolithographic film 132 is made of a photoresist. Each of the first film 131 and the second film 133 may be made of a metal material or a metamaterial. The metal material may be, for example, gold, silver, or copper, which has a refractive index smaller than 1 for a deep-ultraviolet, visible, or infrared light. The metamaterial may be a combination of some compound materials and certain materials. The metamaterial may be synthetic to achieve the refractive index smaller than 1 for light having a certain wavelength.

In practical application, the first film 131, the photolithographic film 132, and the second film 133, which are sequentially stacked, may be formed through spin coating techniques, deposition techniques, or ion sputtering techniques. The first film 131, the photolithographic film 132, and the second film 133 may be ground by a device for chemical mechanical grinding, to control flatness and thicknesses of the first film 131, the photolithographic film 132, and the second film 133, respectively.

Figure 5:
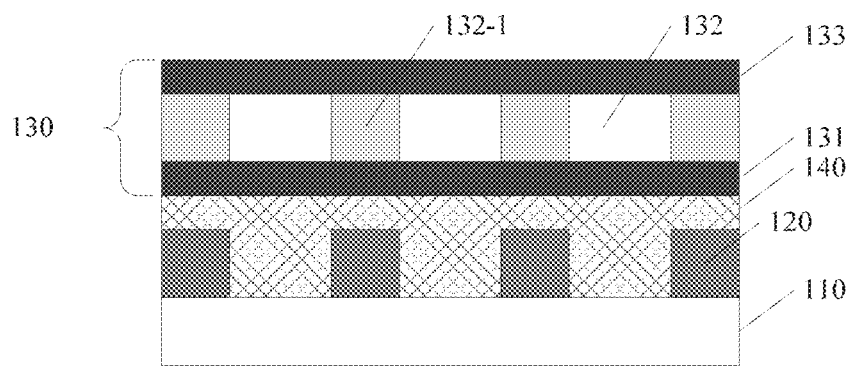

In step S102, the photolithographic coating 130 is exposed to a light having a first wavelength. Reference is made to FIG. 5.

In embodiments of the present disclosure, the photolithographic coating 130 may be exposed through photolithography techniques, after the photolithographic coating 130 is formed on the to-be-connected structure 120.

The photolithographic coating 130 is first exposed to the light having the first wavelength. In the exposure, the photolithographic coating 130 is directly irradiated by a collimated light, and there is no mask. The photolithographic coating 130 provides high reflectivity for the light having the first wavelength, and the to-be-connected structure 120 under the photolithographic coating 130 can be imaged to a first region 132-1 of the photolithographic film 132, as shown in FIG. 5. That is, when the photolithographic coating 130 is exposed to the light having the first wavelength, the to-be-connected structure 120 is equivalent to a mask, and the light having the first wavelength induces a photo-chemical reaction in the first region 132-1 to image the to-be-connected structure 120 to the photolithographic film 132.

In embodiments of the present disclosure, thicknesses of the first film 131, the photolithographic film 132, and the second film 133 in the photolithographic coating 130 may be obtained through simulation in software. Generally, a thickness of the photolithographic film 132 is greater than thicknesses of the first film 131 and the second film 133. The thickness of the photolithographic film 132 affects an intensity of the light in the photolithographic film 132, during the exposure with the light having the first wavelength.

Figure 6:
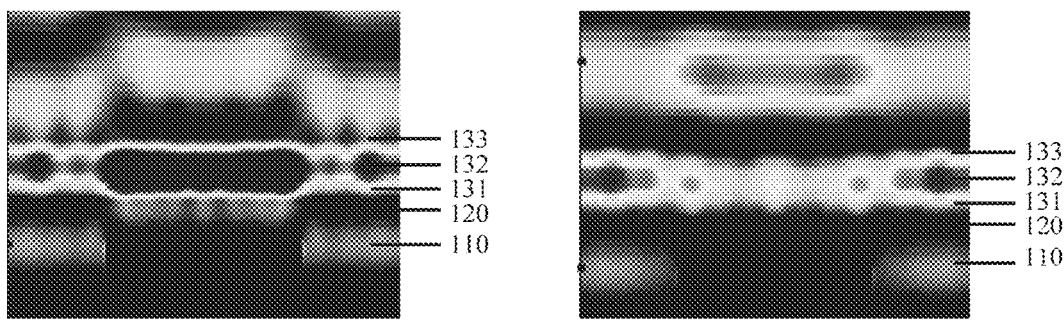
FIG. 6 is a schematic diagram showing correspondence between a thickness of a photolithographic film and intensity of a light according to an embodiment of the present disclosure.

Reference is made to FIG. 6, which is a schematic diagram showing correspondence between the thickness of the photolithographic film and the intensity of the light according to an embodiment of the present disclosure. As can be seen from FIG. 6, the intensity of the light having the first wavelength changes in the photolithographic film 132 along with the thickness of the photolithographic film 132. In this embodiment, a thickness of the photolithographic film 132 may be selected in correspondence to a case in which the light having the first wavelength in the photolithographic film 132 has maximum intensity, so that the to-be-connected structure 120 is imaged to the photolithographic film 132 with maximum efficiency.

Figure 7:
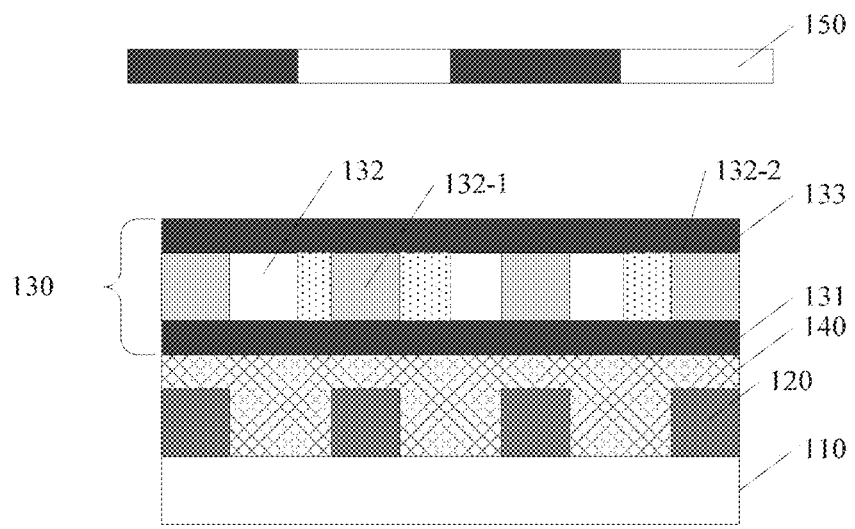
FIG. 7 is a schematic structural diagram of a semiconductor device manufactured through a method according to an embodiment of the present disclosure.

In step S103, the photolithographic coating 130 is exposed to a light having a second wavelength through a mask 150. Reference is made to FIG. 7.

In embodiments of the present disclosure, the photolithographic coating 130 may be further exposed to the light having the second wavelength through the mask 150, after being subject to the exposure with the light having the first wavelength. The to-be-connected structure 120 would not be reflected in the photolithographic film 132, after the light having the second wavelength strikes on the photolithographic coating 130. That is, the light having the second wavelength does not image the to-be-connected structure 120 to the photolithographic film 132.

In other words, the light having the second wavelength images only a pattern of the mask 150 to the second region 132-2 of the photolithographic film 132, and does not image the to-be-connected structure 120 to the photolithographic film 132. The light having the second wavelength induces a photo-chemical reaction in the second region 132-2, and thereby images the pattern of the mask 150 to the photolithographic film 132.

In embodiments of the present disclosure, the photolithographic film 132 has an optical response to both the light having the first wavelength and the light having the second wavelength. When the photolithographic film is first exposed to the light having the first wavelength, a photochemical reaction occurs in the first region 132-1 of the photolithographic film 132, and hence a position of the to-be-connected structure 120 is determined. When the photolithographic film is then exposed to the light having the second wavelength, a photochemical reaction occurs in the second region 132-2 of the photolithographic film 132, and hence a position of a contact hole is determined. Photochemical reactions occur in both exposures in a region in which the first region 132-1 and the second region 132-2 overlap, and such region serves as a connection region corresponding to the to-be-connected structure 120.

In other words, only the region in which imaging regions of the two exposures overlap in the photolithographic film is considered to correspond to the to-be-connected structure. Only the photolithographic film in the connection region would be developed through development techniques in a subsequent step. The other part of photolithographic film, in which only one photochemical reaction occurs or no photochemical reaction occurs, would not be developed. Thereby, achieved is self-alignment between a layer of the to-be-connected structure and a layer in which the contact hole is located, improving accuracy of alignment between different layers and reducing an error of the alignment.

In embodiments of the present disclosure, the light having the first wavelength is capable to image the to-be-connected structure 120 to the photolithographic film 132, and the light having the second wavelength is capable to image the pattern of the mask 150 to the photolithographic film 132. For example, the light having the first wavelength may be a visible light or an ultraviolet light, and the light having the second wavelength may be an ultraviolet light or a visible light. In a case that the second wavelength is smaller than the first wavelength, the pattern of the mask is imaged with higher resolution, and the position of the contact hole is determined more accurately, which facilitates the self-alignment between the layer of the to-be-connected structure and the layer in which the contact hole is arranged. In a case that the first wavelength is smaller than the second wavelength, a fine structure of the to-be-connected structure is reflected in the photolithographic film with high precision, which facilitates increasing a margin for alignment and overlay of the mask and reducing a mask error factor.

As an example, the first wavelength is 633 nm or 532 nm, and the second wavelength is 365 nm, 248 nm, or 193 nm.

As another example, the first wavelength is 365 nm, 248 nm, or 193 nm, and the second wavelength is 532 nm or 633 nm.

Figure 8:
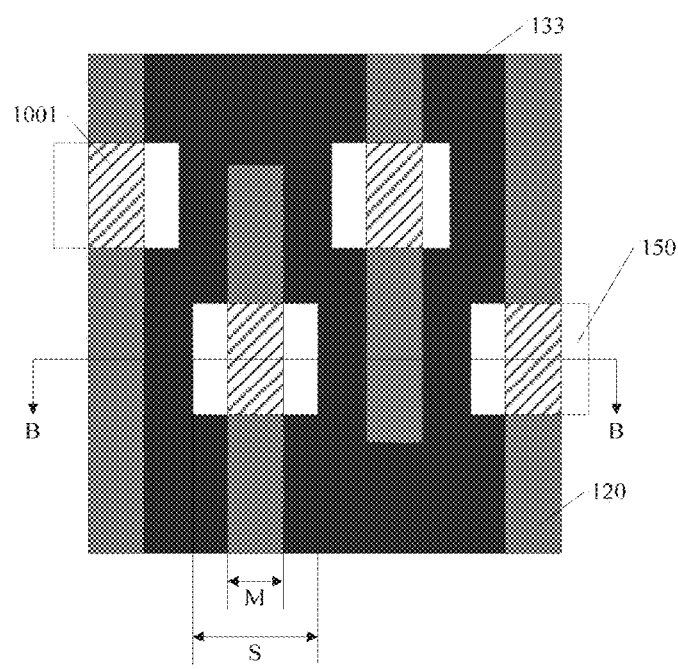
FIG. 8 is a top view of a semiconductor device and a mask according to an embodiment of the present disclosure.

In an embodiment, reference is made to FIG. 8, which is a schematic top view of a semiconductor device and a mask according to an embodiment of the present disclosure. FIG. 7 is a cross-sectional view of the semiconductor device and the mask as shown in FIG. 8 along a direction indicated by BB. A position at which the pattern of the mask 150 is exposed is located in the first region 132-1 of the photolithographic film 132, and a feature size of the pattern of the mask 150 is larger than that of the to-be-connected structure 120, as shown in FIG. 8. An exposure size of the pattern of the mask 150 is S, a feature size of the to-be-connected structure 120 is M. and S is greater than M. Even if a center of the pattern of the mask 150 deviates from a center of the to-be-connected structure 120, an overlapping region between the pattern of the mask 150 and the to-be-connected structure 120 can still be ensured to have a maximum area, hence achieving self-alignment.

As shown in FIG. 8, the pattern of the mask may be consistent with a shape of a hole, so as to form a contact hole in a subsequent step. The mask may be a binary mask or an attenuated phase shift mask. A substrate of the mask may be made of quartz or other non-opaque material. An opaque part of the mask may be formed by a metal material such as chromium.

In embodiments of the present disclosure, when the mask 150 is imaged by the light having the second wavelength in the photolithographic film 130, the photochemical reactions or the developing techniques are controlled, such that only a region irradiated by both the light having the second wavelength and the light having the first wavelength is subject to a secondary photo-chemical reaction and then developed in a subsequent step. The region irradiated by both the light having the second wavelength and the light having the first wavelength serves as the connection region 1001.

In embodiments of the present disclosure, the photolithographic film 132 in a certain region may be modified through laser heating and laser curing, such that the certain region is hard to form an image with the light having the second wavelength. The certain region may be a region other than the first region 132-1.

Figure 9:
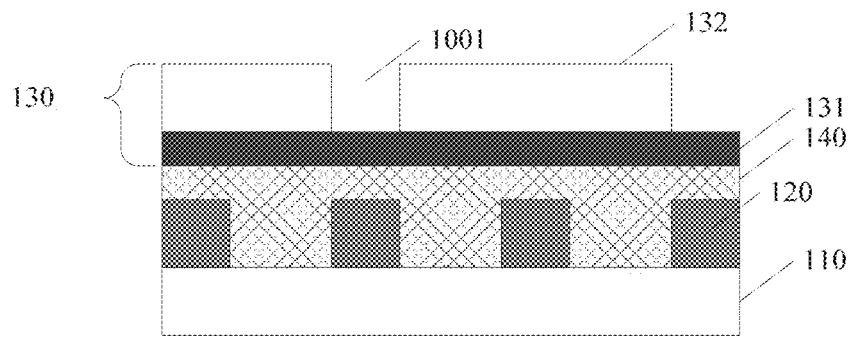
FIG. 9 to FIG. 11 are schematic structural diagrams of a semiconductor device manufactured with a method according to an embodiment of the present disclosure.

In embodiments of the present disclosure, the second film 133 may be removed after the second exposure of the photolithographic coating 130, to facilitate developing the photolithographic film 132 to form a patterned photolithographic film 160. Reference is made to FIG. 9. After the development, the photolithographic film 132 corresponding to the connection region 1001 is removed.

Figure 10:
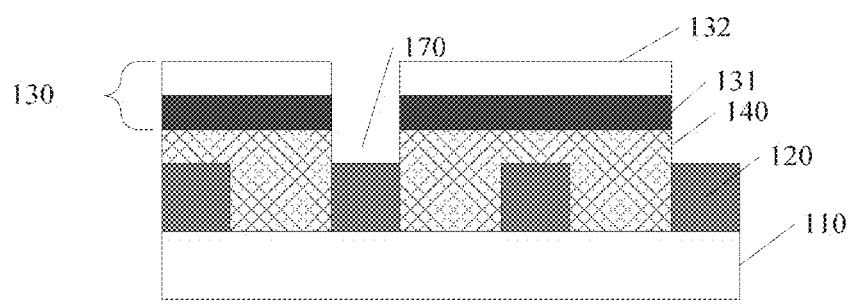

Afterwards, the dielectric layer 140 corresponding to the connection region 1001 is etched through the patterned photolithographic film 160, to obtain a contact hole 170 running through the dielectric layer 140. Thereby, the to-be-connected structure 120 is exposed by the contact hole 170, as shown in FIG. 10. The first film 131 is also etched when the dielectric layer is etched through the patterned photolithographic film 160. After the contact hole 170 running through the dielectric layer 140 is obtained, the remaining photolithographic film 160 and the remaining first film 131 are removed, and only the dielectric layer 140 having the contact hole 170 is retained.

Figure 11:
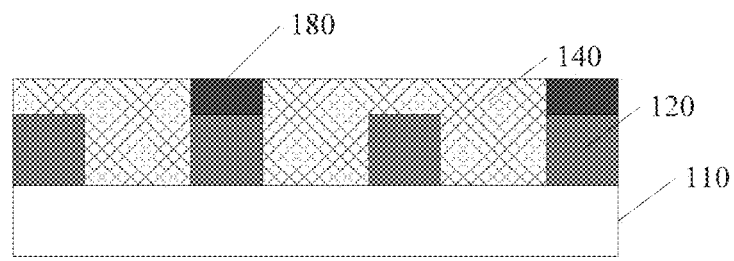

After the contact hole 170 is formed at a position corresponding to the to-be-connected structure 120, a metal material is filled in the contact hole 170 to form a metal contact 180. The metal contact 180 is connected with the to-be-connected structure 120, that is, the to-be-connected structure 120 is electrically connected to outside, as shown in FIG. 11.

In embodiments of the present disclosure, the photolithography techniques for forming the metal contact may be extreme ultraviolet photolithography techniques, deep ultraviolet photolithography techniques, nanometer imprinting techniques, super diffraction photolithography techniques, or other techniques utilizing optical imaging.

The method for manufacturing the semiconductor device is provided according to embodiments of the present disclosure. The semiconductor device includes the substrate and the to-be-connected structure disposed on the side of the substrate. The photolithographic coating is formed on the to-be-connected structure. The photolithographic coating includes the first film, the photolithographic film, and the second film, which are stacked in the above-listed sequence. The refractive indexes of the first film and the second film are smaller than 1, so that the photolithographic coating forms an optical structure with a high reflection coefficient. Then, the photolithographic coating is exposed to the light having the first wavelength. The to-be-connected structure is reflected in the photolithographic coating, and hence serves as a mask and is imaged to the first region of the photolithographic film.

Afterwards, the photolithographic coating is exposed to the light having the second wavelength through the mask. The mask is imaged to the second region of the photolithographic film. The region in which the first region and the second region overlap serves as the connection region corresponding to the to-be-connected structure. That is, positions at the to-be-connected structure are imaged into the first region of the photolithographic film after the exposure with the light having the first wavelength, and the pattern of the mask is imaged to the second region of the photolithographic film after the exposure with the light having the second wavelength. The region in which the first region overlaps the second region corresponds to the to-be-connected structure, and thereby self-alignment between a layer of the to-be-connected structure and a layer where the contact hole is arranged is implemented. Only the region in which the imaging regions of the two exposures overlap corresponds to the to-be-connected structure, which improves accuracy of the alignment between different layers and reduces the error of the alignment.

The embodiments of the present disclosure are described in a progressive manner, and each embodiment places emphasis on the difference from other embodiments. Therefore, one embodiment can refer to other embodiments for the same or similar parts. Since apparatuses disclosed in the embodiments correspond to methods disclosed in the embodiments, the description of the apparatuses is simple, and reference may be made to the relevant part of the methods.

The foregoing embodiments are only preferred embodiments of the present disclosure. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure.

The invention claimed is:

1. A method for manufacturing a semiconductor device, wherein:
    the semiconductor device comprises a substrate and a to-be-connected structure disposed on a side of the substrate; and
    the method comprises:
        forming a photolithographic coating on the to-be-connected structure, wherein the photolithographic coating comprises a first film, a photolithographic film, and a second film which are stacked in the above-listed sequence, and refractive indexes of the first film and the second film are smaller than 1;
        exposing the photolithographic coating to a light having a first wavelength, to image the to-be-connected structure to a first region of the photolithographic film;
        exposing the photolithographic coating to a light having a second wavelength through a mask, to image a pattern of the mask to a second region of the photolithographic film; and
        forming an electrical connection in contact with the to-be-connected structure at a connection region, wherein the connection region is a region in which the first region and the second region overlap.

2. The method according to claim 1, wherein before forming the photolithographic coating on the to-be-connected structure, the method further comprises:
    determining a thickness of the photolithographic coating based on simulated light intensity, which in the photolithographic film when the photolithographic coating is exposed to the light having the first wavelength.

3. The method according to claim 2, wherein the thickness of the photolithographic film is determined in correspondence to a case in which the light having the first wavelength in the photolithographic film has maximum intensity.

4. The method according to claim 1, wherein:
    before forming the photolithographic coating on the to-be-connected structure, the method further comprises:
        forming a dielectric layer on the to-be-connected structure, wherein the dielectric layer is disposed between the to-be-connected structure and the photolithographic coating; and
    after exposing the photolithographic coating to the light having the second wavelength through the mask, the method further comprises:
        etching the dielectric layer corresponding to the connection region through the photolithographic film, to obtain a contact hole running through the dielectric layer, wherein the to-be-connected structure is exposed by the contact hole.

5. The method according to claim 4, wherein before etching the dielectric layer corresponding to the connection region through the photolithographic film, the method further comprises:
    removing the second film.

6. The method according to claim 4, wherein after etching the dielectric layer corresponding to the connection region through the photolithographic film to obtain the contact hole running through the dielectric layer, the method further comprises:

filling the contact hole with metal to form a metal contact, wherein the metal contact is connected with the to-be-connected structure.

7. The method according to claim 1, wherein the photolithographic film is made of a photoresist, and the first film and the second film are made of metal materials.

8. The method according to claim 7, wherein the metal materials of the first film and the second film are gold, silver, or copper.

9. The method according to claim 1, wherein the light having the first wavelength is a visible light or an ultraviolet light, and the light having the second wavelength is another ultraviolet light.

10. The method according to claim 9, wherein the first wavelength is 633 nm, 532 nm, or 365 nm, and the second wavelength is 365 nm, 248 nm, or 193 nm.

11. The method according to claim 1, wherein the to-be-connected structure is at least one of: a gate structure, a source structure, or a drain structure.

12. The method according to claim 1, wherein a feature size of the pattern of the mask is larger than a feature size of the to-be-connected structure.

13. The method according to claim 1, wherein a thickness of the photolithographic film is greater than a thickness of each of the first film and the second film.

\* \* \* \* \*